United States Patent [19]
Seesink

[11] Patent Number: 5,483,434
[45] Date of Patent: Jan. 9, 1996

[54] HIGH VOLTAGE GENERATOR HAVING OUTPUT CURRENT CONTROL

[76] Inventor: Petrus H. Seesink, Chamonixlaan 210, NL-5627 Ke Eindhoven, Netherlands

[21] Appl. No.: 256,511
[22] PCT Filed: Dec. 29, 1992
[86] PCT No.: PCT/NL92/00237
  § 371 Date: Jan. 3, 1995
  § 102(e) Date: Jan. 3, 1995
[87] PCT Pub. No.: WO93/14554
  PCT Pub. Date: Jul. 22, 1993

[30] Foreign Application Priority Data

Jan. 14, 1992 [NL] Netherlands ............... 9200056

[51] Int. Cl.$^6$ ................................. H02M 3/07
[52] U.S. Cl. ................................. 363/60; 307/110
[58] Field of Search ............... 363/59, 60; 307/110; 327/530, 537

[56] References Cited

U.S. PATENT DOCUMENTS

| | | | |
|---|---|---|---|
| 4,979,088 | 12/1990 | Misaki et al. ............... | 363/60 |
| 5,006,974 | 4/1991 | Kazerounian et al. ............ | 363/60 |
| 5,036,229 | 7/1991 | Tran ............................. | 327/536 |
| 5,175,706 | 12/1992 | Edme ............................ | 365/226 |
| 5,412,257 | 5/1995 | Cordoba et al. ............... | 327/536 |

FOREIGN PATENT DOCUMENTS 56-94962  7/1981  Japan.

*Primary Examiner*—Peter S. Wong
*Assistant Examiner*—Adolf Berhane
*Attorney, Agent, or Firm*—Young & Thompson

[57] ABSTRACT

High voltage generator including several voltage multiplying stages connected in series, each having a diode and a capacitor one terminal of which being connected to the cathode of the respective diode, every cathode of a diode being connected to the anode of the diode of the next voltage multiplying stage, a clock generator generating two clock pulses being 180° out of phase to one another and being supplied alternately to the other terminal of the capacitors of successive voltage multiplying stages, the last diode in the series supplying a high voltage output and the high voltage output being connected to feed-back circuit, modifying the two clock pulses in dependence on the voltage level on the high voltage output, at least the capacitor (Cn) in the last voltage multiplying stage receiving a control current (I1) determined by the feed-back circuit instead of one of both clock pulses.

6 Claims, 6 Drawing Sheets

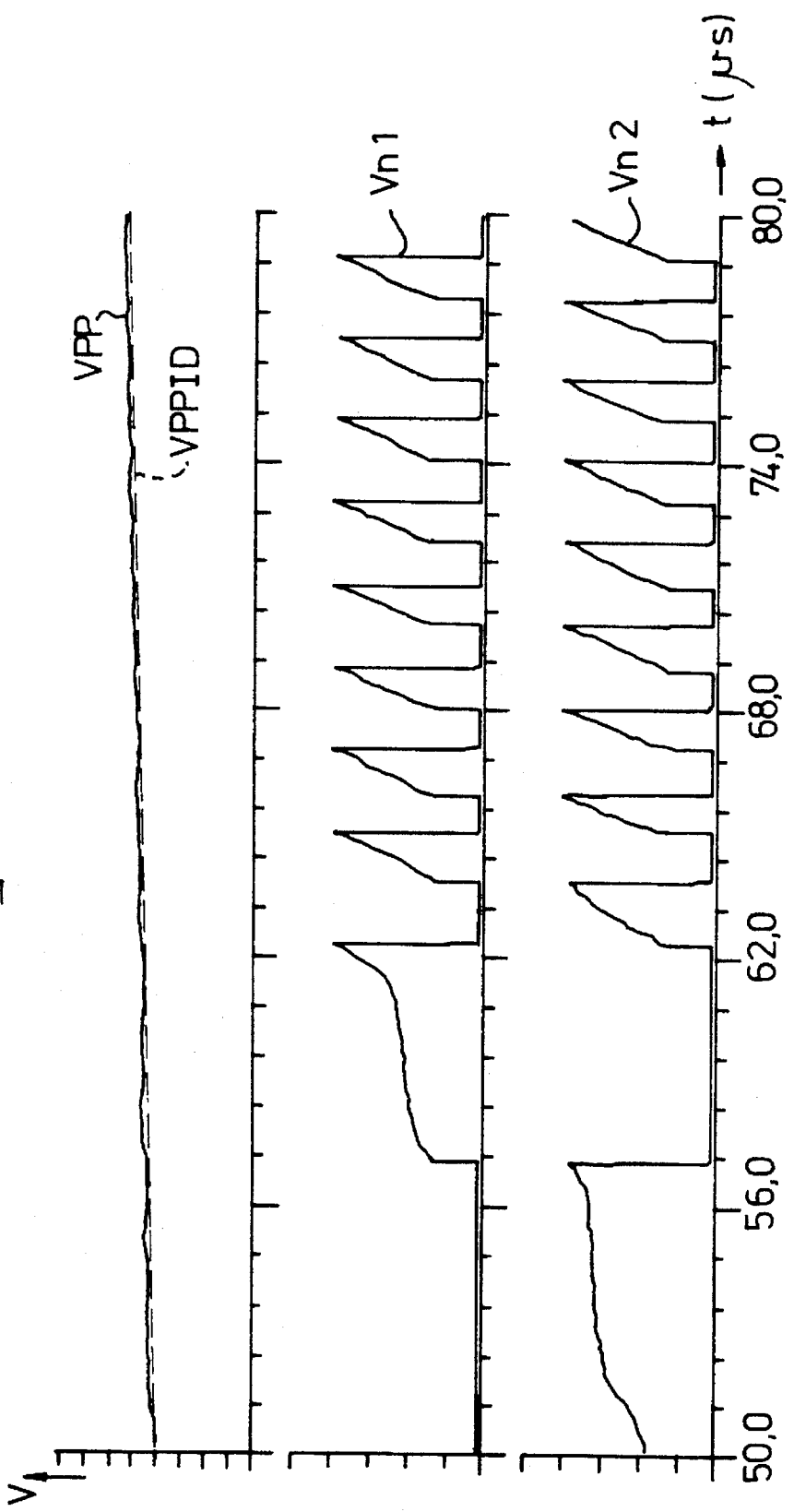

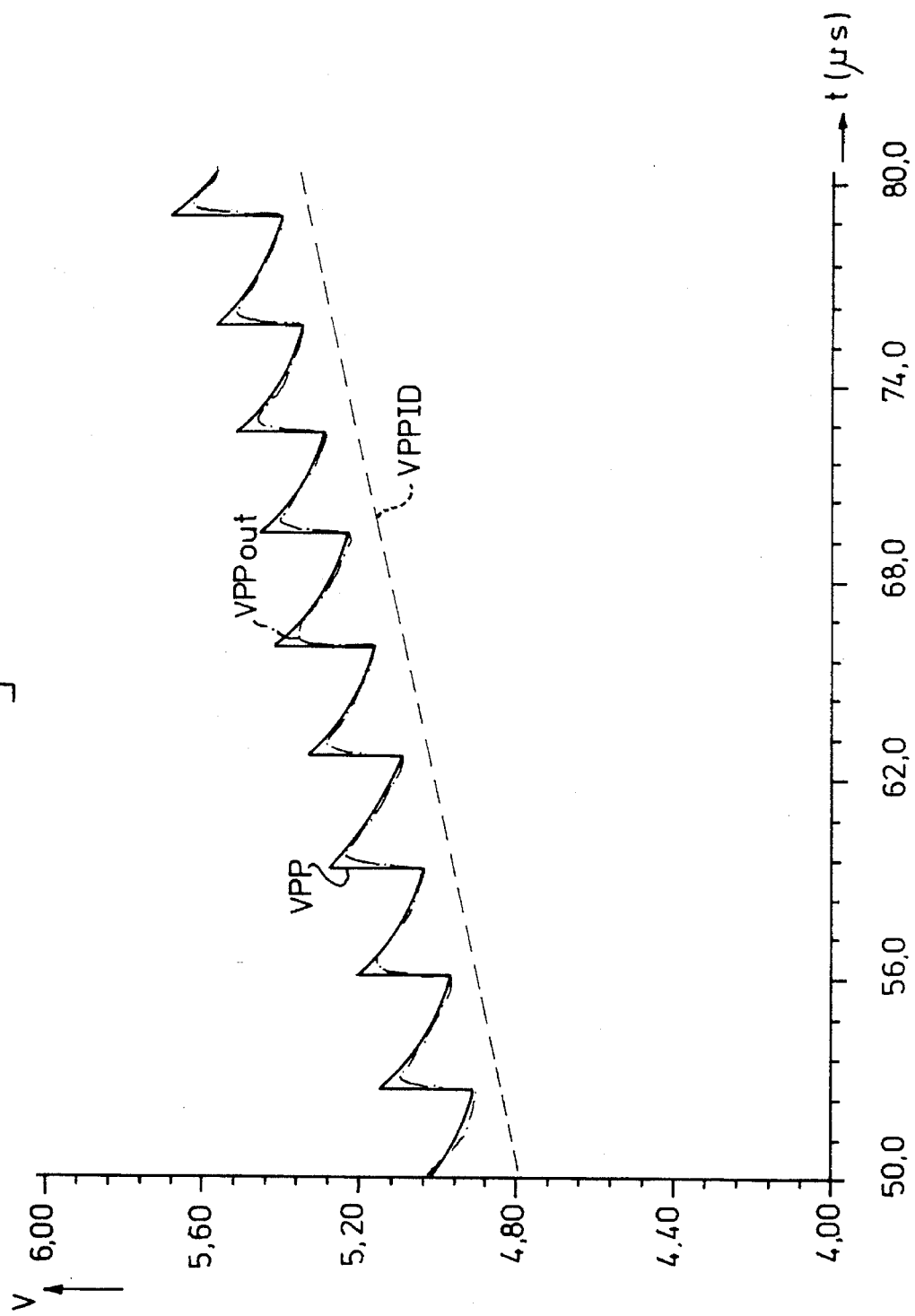

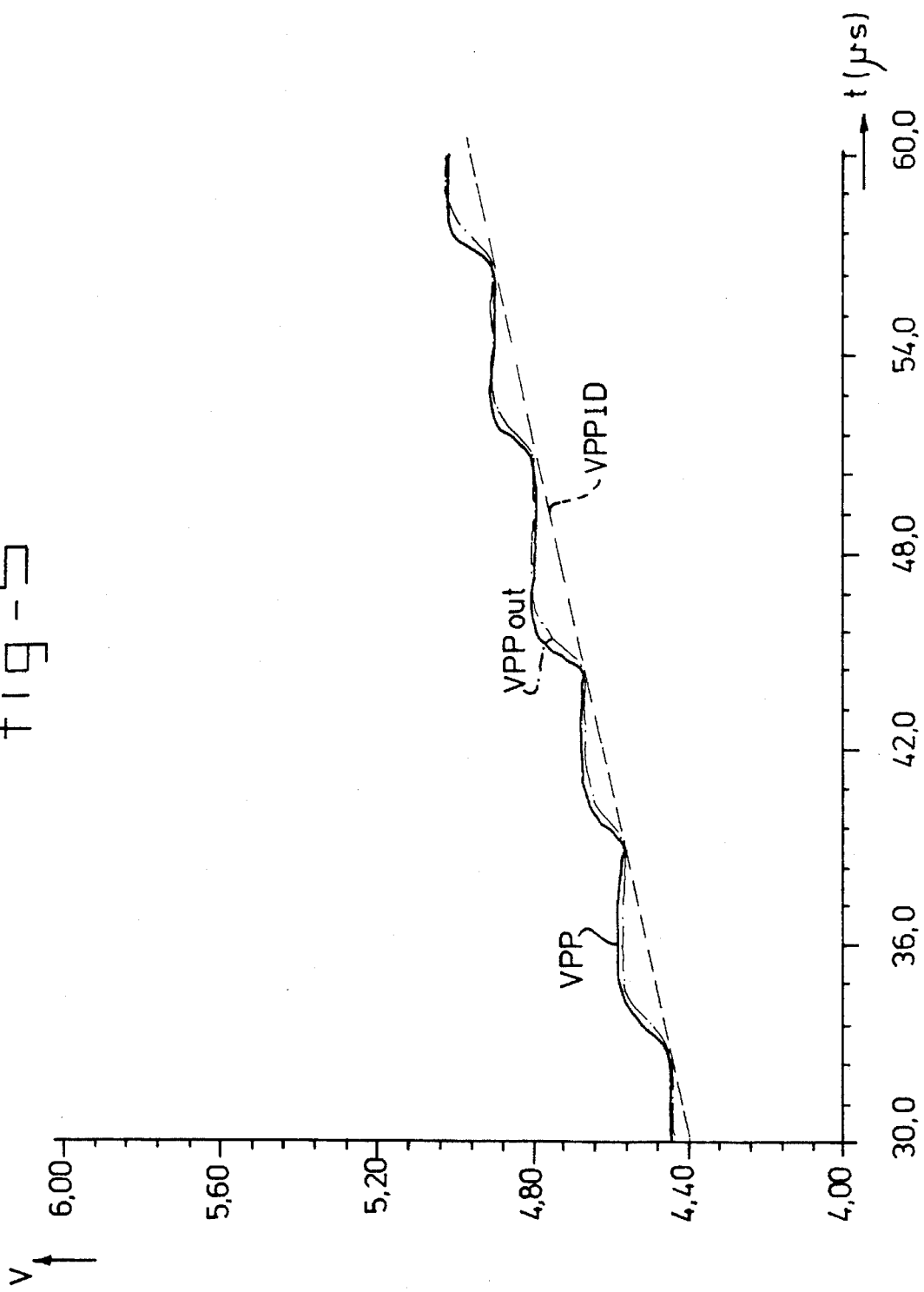

HIGH VOLTAGE GENERATOR HAVING OUTPUT CURRENT CONTROL

BACKGROUND OF THE INVENTION

The invention relates to a high voltage generator comprising a first series of voltage multiplying stages, each stage comprising a diode and a capacitor one terminal of which being connected to the cathode of the respective diode, wherein every cathode of a diode is connected to the anode of the diode of the next voltage multiplying stage, a clock generator which is able to generate clock pulses being 180° out of phase with one another and being supplied alternately to the other terminal of the capacitors of successive voltage multiplying stages, the last diode in the series having a high voltage output and said high voltage output being connected to feed-back means, which modifies said two clock pulses in dependence on the voltage on the high voltage output.

DESCRIPTION OF THE PRIOR ART

Such a high voltage generator is known from the European patent application 0,350,462. Said known high voltage generator generates a high voltage pulse for instance to program (E)EPROM-memory cells. Therefore, a voltage of about 5 V is converted in a pulse of about 16 V, which value is sufficient to program (E)EPROM-memory cells. Every voltage multiplying stage functions as a charge pump and after each stage a voltage increase at most equal to the step value of the clock pulse less the threshold voltage of the diodes occurs.

A disadvantage of said known arrangement is that the high voltage output shows spikes whenever one of both clock pulses switches.

Japanese patent application JP-A-56.094962 discloses a transformerless type DC/DC converter which is controlled by two reverse-phased clock pulses $\phi_1$ and $\phi_2$. The output voltage of the output terminal is entirely determined by PWM-control of the two reverse-phased clock pulses.

U.S. Pat. No. 5,036,229 discloses an arrangement comprising multiple multiplier stages in a charge pump, which multiplier stages are controlled by clock pulses. The application of several charge pumps in parallel are described.

SUMMARY OF THE INVENTION

The object of the invention is to provide an arrangement neutralizing the disadvantage related to the prior art and the output voltage of which does not show any spikes any more.

The arrangement according to the invention is therefore characterized in that at least the last capacitor of the multiplying stages is connected to a junction in order to be supplied with a control voltage during operation, said junction being connected to an input of a control circuit having two outputs, said junction also being connected to current charging means, which is controlled by one of said two outputs of the control circuit and by the feed-back means, and to current discharge means controlled by the other of said two outputs of the control circuit, in such a way that when, during operation, the control voltage increases to a first predetermined level the control circuit operates to deactivate said current charging means and to activate said current discharge means, and when the control voltage decreases to a second predetermined level the control circuit operates to deactivate said current discharge means and to activate said current charging means.

By shaping the current supplied by the current charge means and the current lead away by the current discharge means in a proper way the spikes on the high voltage output may be substantially reduced.

In a first embodiment of the invention only said capacitor in said last voltage multiplying stage is connected to said junction to receive said control voltage.

In a preferred embodiment of the invention the high voltage generator is characterized in that said feed-back means comprises a high voltage feed-back circuit connected to the high voltage output, in that the output of the high voltage feed-back circuit is connected to the input of an operational amplifier the other input of which is connected to a reference voltage, in that the current charge means comprises a current source controlled by an output of the operational amplifier, and a first switch which is connected in series with said current source and is controlled by said one of said two outputs of the control circuit, in that the current discharge means comprises a second switch being controlled by said other of said two outputs of the control circuit, and in that the control circuit is said clock generator which is able to generate clock pulses being 180° out of phase with one another at its outputs.

By the application of the latter measures the frequency of the clock pulses is determined by the load. Therefore, in the preferred embodiment the voltage multiplier only pumps charge to its output when it is needed there.

When, during operation, the control voltage exceeds the first predetermined level, said clock pulses switch in such a way that said first switch controlled by clock pulse is opened and said second switch controlled by clock pulse is closed and when the input voltage decreases below the second predetermined level said clock pulses switch again resulting in closing the first switch and opening of said second switch.

Preferably, a second identical high voltage generator is provided, the second identical high voltage generator having voltage multiplying stages being alternately supplied with the clock pulses, however, in a reverse order relative to the order of the high voltage generator, the high voltage outputs of both high voltage generators being connected to one another in such a way, that when one of both high voltage generators does not supply any control current but charges its respective last capacitor the other high voltage generator supplies said control current.

In such a preferred embodiment, said feed-back means may comprise a high voltage feed-back circuit connected to the high voltage output, in that the output of the high voltage feed-back circuit is connected to the input of an operational amplifier the other input of which is connected to a reference voltage, in that the current charge means comprises a current source controlled by an output of the operational amplifier, and a first switch which is connected in series with said current source and is controlled by said one of said two outputs of the control circuit, in that the current discharge means comprises a second switch being controlled by said other of said two outputs of the control circuit, in that the control circuit is said clock generator which is able to generate clock pulses being 180° out of phase with one another at its outputs, in that a second series of voltage multiplying stages parallel to the first series of multiplying stages is provided, the second series being identical to the first series, in that the last stage of the second series of multiplying stages is connected to a junction of a series connection of two further switches parallel to the first and second switches and to a further input of the clock generator, the further switches being also controlled by said clock pulses, however, in a reverse order.

BRIEF DESCRIPTION OF THE DRAWINGS

The invention will be hereinafter explained by reference to some drawings. In the drawings

FIG. 3 shows a simulated diagram of the two clock pulses controlling the charge pumps;

FIG. 4 shows a simulated diagram of a part of the rising edge of a programming pulse without current control of the last capacitor;

FIG. 5 shows a simulated diagram of a part of the rising edge of a programming pulse with current control of the last capacitor;

DETAILED DESCRIPTION OF THE EMBODIMENTS

Figure 1:
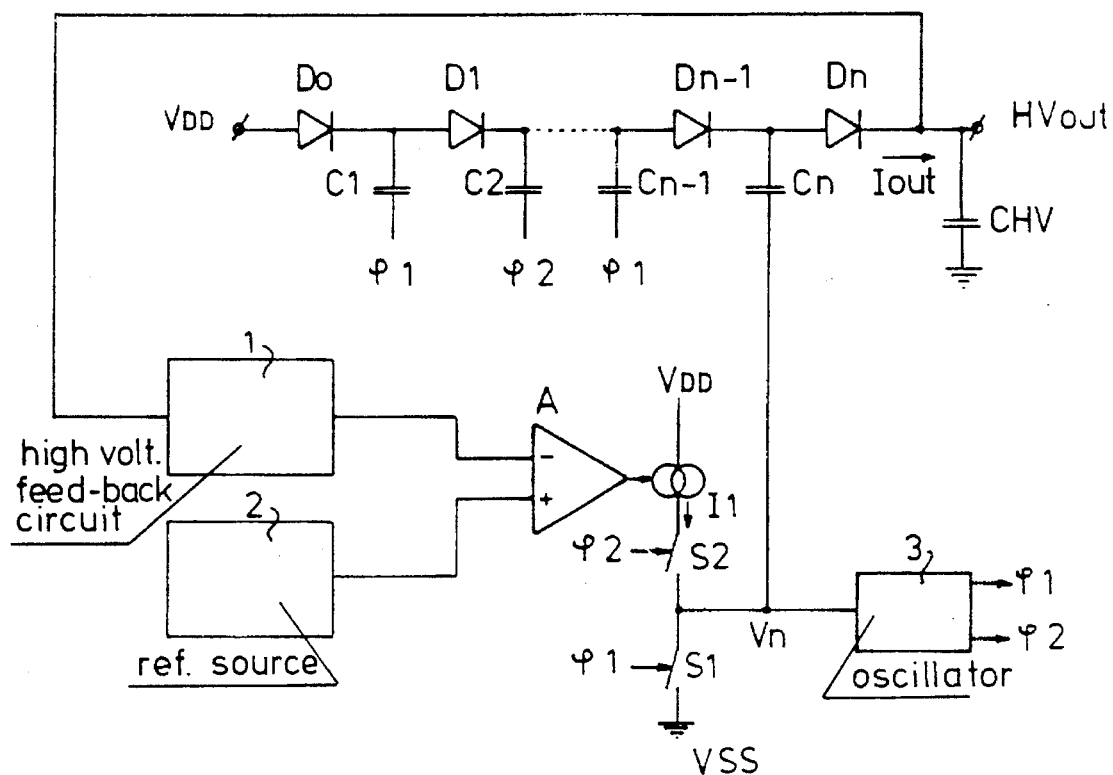
FIG. 1 shows the circuit according to the invention, partly in block diagram.

FIG. 1 shows the invention partly in block diagram. The figure shows a voltage multiplier known as such comprising several charge pumps connected in series. Every charge pump consists of a diode Di and a capacitor Ci+1 connected to its cathode. At its other terminal each capacitor receives a clock pulse ($\phi$1 or $\phi$2) generated by an oscillator 3. The oscillator 3 generates two clock pulses being 180° out of phase with respect to one another, said clock pulses being supplied alternately to the successive capacitors Ci. In this voltage multiplier known as such every stage substantially doubles its input voltage. The diodes D0 . . . Dn may be MOS-transistors connected as diodes.

In the arrangement according to the invention the last capacitor Cn is not controlled by one of both clock pulses $\phi$1 or $\phi$2, but by a control current I1. This provides the possibility to reduce spikes on the high voltage output during switching of the clock pulses $\phi$1 and $\phi$2.

The current control of the last capacitor is provided by means of feed-back means comprising a high voltage feed-back circuit 1, a reference source 2, an operational amplifier A, a current source I1 and two switches S1 and S2 controlled by the clock pulses $\phi$1 and $\phi$2. The output of the high voltage feed-back circuit 1 is connected to the inverting input of the operational amplifier A, the non-inverting input of which receives a reference voltage (or reference current) from a reference voltage or reference current source 2. The output of the operational amplifier A controls the output current of the current source I1. The output of the current source I1 is connected to ground (VSS) through two switches S1 and S2 being connected in series and being controlled by $\phi$1 and $\phi$2, respectively. The junction of the switches S1 and S2 provides the voltage Vn to the last capacitor Cn, as well as the input voltage of the oscillator 3.

Figure 2:
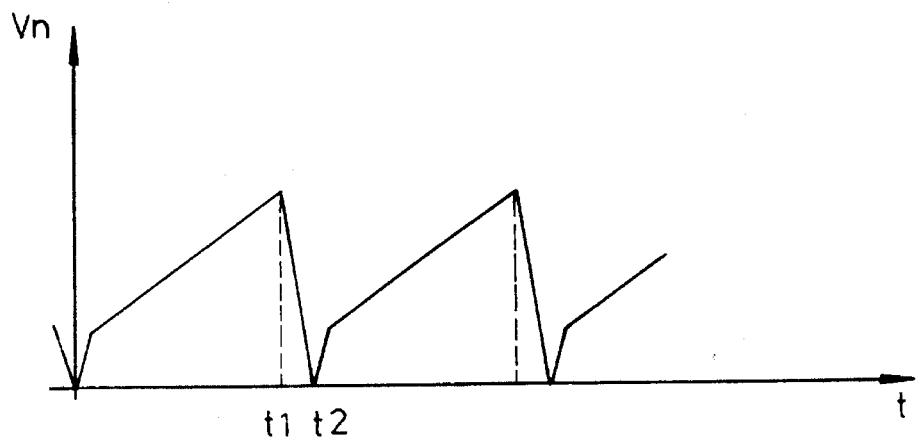
FIG. 2 shows the voltage being supplied to the last capacitor instead of one of both clock pulses.

FIG. 2 shows the voltage Vn to the last capacitor Cn as a function of time. If Vn increases Cn is discharged through Dn and a load connected to the high voltage output $HV_{out}$. Then, the switch S2 controlled by $\phi$2 is closed, while the switch S1 controlled by $\phi$1 is opened. Switch S2 supplies the current I1 to the capacitor Cn, in such a way that the output current $I_{out}$ is also equal to I1. At a certain moment t1 Vn exceeds a predetermined threshold value and the oscillator 3 switches: the outputs $\phi$1 and $\phi$2 change sign. The switches S1 and S2 controlled by $\phi$1 and $\phi$2, respectively, switch, i.e. S2 opens and S1 closes. The voltage Vn decreases to ground potential (VSS) the rate of which being determined by the resistance of S1, after which the capacitor Cn is charged through diode Dn-1. At moment t2 oscillator 3 switches again, after which Vn increases again and Cn discharges again by the current $I_{out}$= I1 through Dn and the load.

If I1 is a controlled current also the output current $I_{out}$ is a controlled current. The voltage Vn has a saw-tooth shape. The slope of the rising edge is determined by I1 being in turn controlled by the high voltage feed-back circuit 1. Since the high voltage feedback circuit 1 is controlled by the high voltage output $HV_{out}$ the slope of Vn is determined by the load connected to the high voltage output. Furthermore, because Vn also controls the oscillator the frequency of the clock pulses $\phi$1 and $\phi$2 is determined by the load. The voltage multiplier, therefore, only pumps charge to the output $HV_{out}$ when it is needed there. So, the voltage multiplier according to the invention does not only have the advantage of having an output being current controlled and having reduced spikes on the output voltage, but also shows frequency control of the oscillator.

Figure 1A:
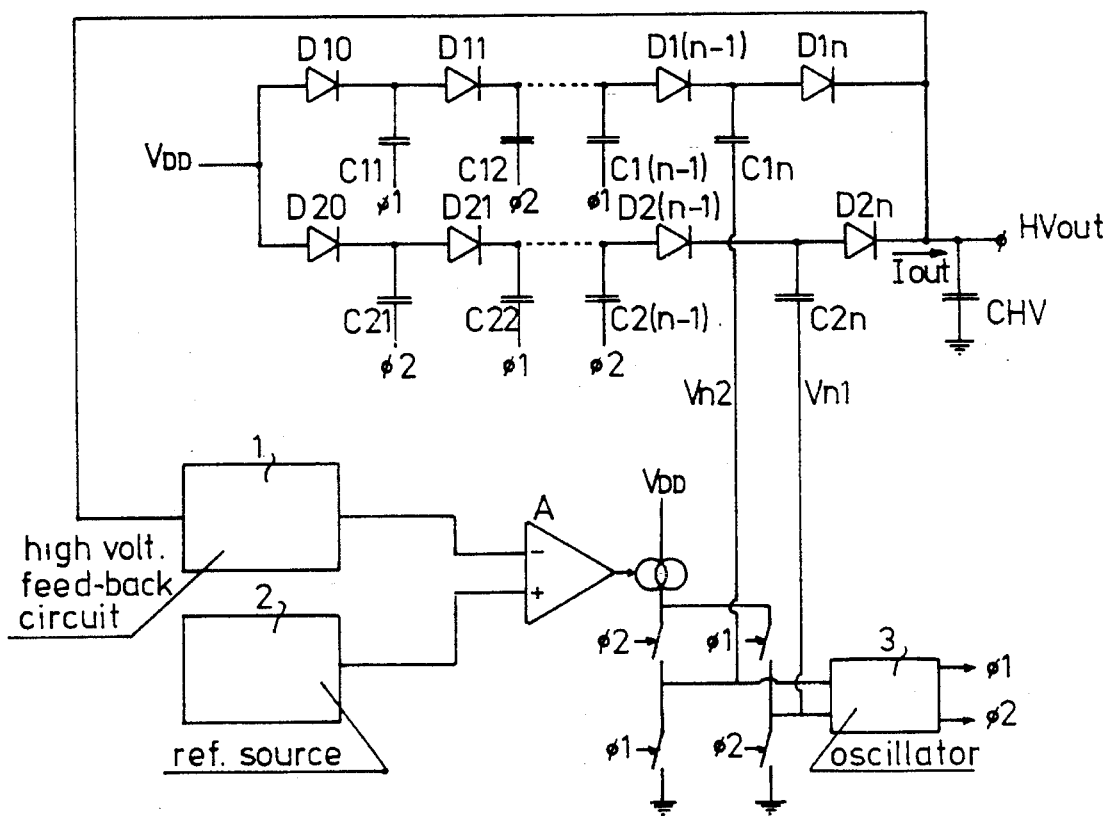
FIG. 1A shows an alternative circuit according to the invention.

In FIG. 1 a single multiplying circuit is shown. A disadvantage of such a single circuit is that no output current $I_{out}$ can flow during the falling edge of control signal Vn. In practice this problem is solved by applying an additional, identical voltage multiplier, in which the voltages $\phi$1 and $\phi$2 have inverted values compared to those in the arrangement of FIG. 1. At the moments that Vn in the arrangement according to FIG. 1 decreases and, therefore, no output current is supplied, the other identical voltage multiplier in such a double-phase arrangement will supply an output current I1, so that always: $I_{out}$=I1. Such a double-phase circuit is shown in FIG. 1A.

FIG. 3 shows a simulation of a double-phase embodiment of the arrangement according to FIG. 1. Here, Vn1 is equivalent to Vn in FIG. 1 for one phase and Vn2 for the other phase. The frequencies of $\phi$1 and $\phi$2 correspond to those of Vn1 and Vn2, respectively. In FIG. 3 one can see how this frequency is determined by the load. On top of FIG. 3 a part of the simulated curve of the rising edge of a programming pulse VPP may be seen. VPPID shows the ideal, desired curve of VPP. The two other curves show the control signals Vn1 and Vn2. After 60 µs a heavier load is connected to the output $HV_{out}$. One can clearly observe the slopes of Vn1 and Vn2 becoming more steep and, therefore, the frequency increases. The voltage jump at the beginning of every pulse is caused by the charge pump diode threshold voltage to be exceeded. The spikes in the control signals only reach the capacitors being controlled by them, however, they do not reach the output of the charge pump as long as the circuit is properly dimensioned.

Figure 6:
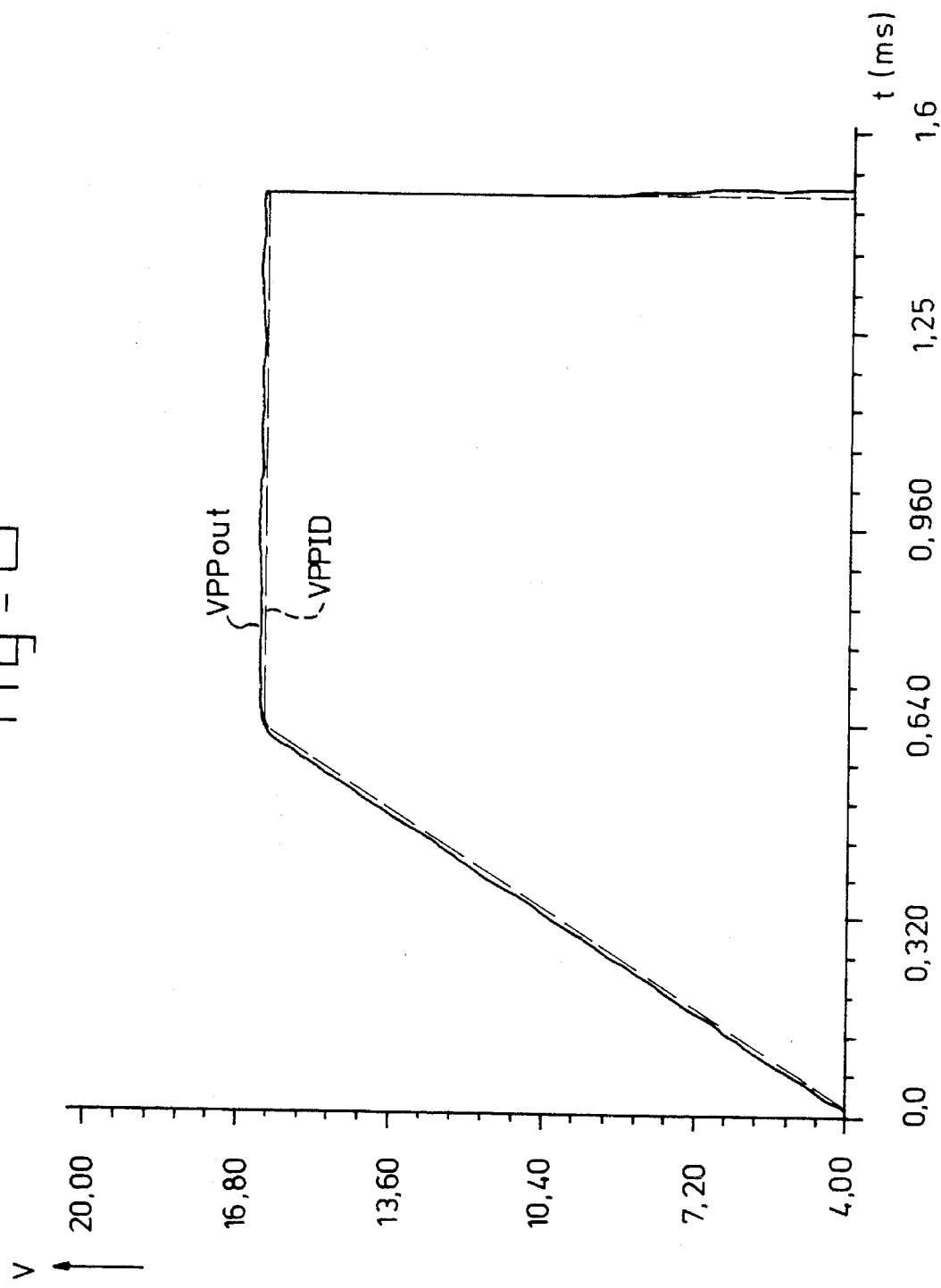
FIG. 6 shows a simulated diagram of a programming pulse generated by means of the arrangement according to the invention.

FIGS. 4, 5 and 6 show resulting programming pulses VPP as a function of time. FIG. 4 shows VPP in case the last capacitor Cn is not current controlled, but like the other capacitors receives one of both clock pulses $\phi$1 or $\phi$2. FIG. 4 only shows a part of the rising edge of the programming pulse. VPP is the output signal of the charge pump, while VPPOUT is the output signal of a (small) low pass filter receiving VPP as input signal. FIG. 5 shows that in the arrangement according to the invention, applying current control of the last capacitor Cn, spikes caused by the clock pulses are less powerful in the programming pulse VPP. When comparing FIGS. 4 and 5 it has to be observed that FIG. 5 has been simulated utilizing a capacitor (CHV) between $HV_{out}$ and ground (VSS) having a magnitude of more than six times smaller than the one in FIG. 4. If FIG. 4 would have been simulated utilizing the same capacitor as used in the simulation of FIG. 5 the spikes on the VPP-signal in FIG. 4 would have been about six times larger. FIG. 6 shows an entire programming pulse as may be realized with the arrangement according to the invention. One can clearly see how exactly the real pulse VPPOUT precisely follows the ideal pulse VPPID.

The invention is not limited to the current control of the last capacitor Cn. Principally, it is possible to control the current of other capacitors. However, generally this results in a lower efficiency of the charge pump. Moreover, then the output current no longer equals I1 and, therefore, this current is defined less well.

I claim:

1. High voltage generator comprising a first series of voltage multiplying stages, each stage comprising a diode (D0 ... Dn) and a capacitor (C1 ... Cn) one terminal of which being connected to the cathode of the respective diode, wherein every cathode of a diode is connected to the anode of the diode of the next voltage multiplying stage, a clock generator (3) which is able to generate clock pulses ($\phi1$, $\phi2$) being 180° out of phase with one another and being supplied alternately to the other terminal of the capacitors of successive voltage multiplying stages, the last diode in the series having a high voltage output and said high voltage output being connected to feed-back means, which modifies said two clock pulses in dependence on the voltage (HVout) on the high voltage output, characterized in that at least the last capacitor (Cn) of the multiplying stages is connected to a junction in order to be supplied with a control voltage (Vn) during operation, said junction being connected to an input of a control circuit (3) having two outputs, said junction also being connected to current charging means (I1, S2), which is controlled by one of said two outputs of the control circuit (3) and by the feed-back means (1, 2, A), and to current discharge means (S1) controlled by the other of said two outputs of the control circuit (3), in such a way that when, during operation, the control voltage (Vn) increases to a first predetermined level the control circuit (3) operates to deactivate said current charging means (I1, S2) and to activate said current discharge means (S1), and when the control voltage (Vn) decreases to a second predetermined level the control circuit (3) operates to deactivate said current discharge means (S1) and to activate said current charging means (I1, S2).

2. High voltage generator according to claim 1, characterized in that only said capacitor (Cn) in said last voltage multiplying stage is connected to said junction to receive said control voltage (Vn).

3. High voltage generator according to claim 1, characterized in that said feed-back means comprises a high voltage feed-back circuit (1) connected to the high voltage output ($HV_{out}$), in that the output of the high voltage feed-back circuit (1) is connected to the input of an operational amplifier (A) the other input of which is connected to a reference voltage, in that the current charge means comprises a current source (I1) controlled by an output of the operational amplifier (A), and a first switch (S2) which is connected in series with said current source (I1) and is controlled by said one of said two outputs of the control circuit (3), in that the current discharge means comprises a second switch (S1) being controlled by said other of said two outputs of the control circuit (3), and in that the control circuit (3) is said clock generator which is able to generate clock pulses being 180° out of phase with one another at its outputs.

4. High voltage generator according to claim 3, characterized in that when, during operation, the control voltage (Vn) exceeds the first predetermined level, said clock pulses ($\phi1$, $\phi2$) switch in such a way that said first switch (S2) controlled by clock pulse ($\phi2$) is opened and said second switch (S1) controlled by clock pulse ($\phi1$) is closed and when the input voltage decreases below the second predetermined level said clock pulses switch again resulting in closing the first switch (S2) and opening of said second switch (S1).

5. High voltage generator according to claim 1, characterized in that a second identical high voltage generator is provided, the second identical high voltage generator having voltage multiplying stages being alternately supplied with the clock pulses ($\phi1$, $\phi2$), however, in a reverse order relative to the order of the high voltage generator, the high voltage outputs of both high voltage generators being connected to one another in such a way, that when one of both high voltage generators does not supply any control current (I1) but charges its respective last capacitor the other high voltage generator supplies said control current (I1).

6. High voltage generator according to claim 5 characterized in that said feed-back means comprises a high voltage feed-back circuit (1) connected to the high voltage output ($HV_{out}$), in that the output of the high voltage feed-back circuit (1) is connected to the input of an operational amplifier (A) the other input of which is connected to a reference voltage, in that the current charge means comprises a current source (I1) controlled by an output of the operational amplifier (A), and a first switch (S2) which is connected in series with said current source (I1) and is controlled by said one of said two outputs of the control circuit (3), in that the current discharge means comprises a second switch (S1) being controlled by said other of said two outputs of the control circuit (3), in that the control circuit (3) is said clock generator which is able to generate clock pulses being 180° out of phase with one another at its outputs, in that a second series of voltage multiplying stages parallel to the first series of multiplying stages is provided, the second series being identical to the first series, in that the last stage of the second series of multiplying stages is connected to a junction of a series connection of two further switches parallel to the first (S2) and second (S1) switches and to a further input of the clock generator (3), the further switches being also controlled by said clock pulses ($\phi1$, $\phi2$), however, in a reverse order.

\* \* \* \* \*